United States Patent [19]
Wong

[11] Patent Number: 5,214,394
[45] Date of Patent: May 25, 1993

[54] HIGH EFFICIENCY BI-DIRECTIONAL SPATIAL POWER COMBINER AMPLIFIER

[75] Inventor: Sam H. Wong, Yorba Linda, Calif.

[73] Assignee: Rockwell International Corporation, Seal Beach, Calif.

[21] Appl. No.: 685,104

[22] Filed: Apr. 15, 1991

[51] Int. Cl.[5] .......................... H03F 3/6; H01Q 23/00
[52] U.S. Cl. ..................... 330/286; 330/295;
333/21 A; 333/137; 343/70 MS; 343/786
[58] Field of Search ............ 333/21 A, 125, 137;
330/124 R, 295, 286; 343/700 MS, 701, 753, 756, 784, 786, 909, 754

[56] References Cited
U.S. PATENT DOCUMENTS

| | | | |
|---|---|---|---|
| 3,852,755 | 12/1974 | Works et al. | 343/701 |
| 4,010,471 | 3/1977 | Smith | 343/754 |
| 4,198,640 | 4/1980 | Bowman | 343/754 |
| 4,291,278 | 9/1981 | Quine | 330/286 |
| 4,464,663 | 8/1984 | Lalezari et al. | 343/700 MS |
| 4,583,055 | 4/1986 | Yen et al. | 331/96 |
| 4,588,962 | 5/1986 | Saito et al. | 333/137 |
| 4,792,813 | 12/1988 | Rosen | 343/DIG. 2 |

FOREIGN PATENT DOCUMENTS 2039699 8/1980 United Kingdom .............. 343/786

Primary Examiner—Rolf Hille
Assistant Examiner—Peter Toby Brown
Attorney, Agent, or Firm—H. Fredrick Hamann; George A. Montanye; David J. Arthur

[57] ABSTRACT

The present invention is a high efficiency bi-directional spatial power combiner for extremely high frequency signals. In one embodiment, orthogonally polarized electro-magnetic waves are used to isolate signals going into and out of a planar array of amplifiers. A dual mode horn transmits vertically polarized fields to a MMIC planar array of amplifiers. Vertically polarized array elements receive the signals, amplify them, and retransmit back to the horn using horizontally polarized array elements. An ortho-mode transducer on the horn provides isolation for the two polarized signals. The backside of the array can be used for a heat sink, and to provide access for DC biasing of the array elements. In a second embodiment, monolithic grid oscillators are used in lieu of power amplifiers with orthogonal polarization array elements. The input signal and the output signal are of the same polarization. A circulator is used in lieu of an ortho-mode transducer to isolate the input signal from the output signal.

19 Claims, 19 Drawing Sheets

HIGH EFFICIENCY BI-DIRECTIONAL SPATIAL POWER COMBINER AMPLIFIER

BACKGROUND OF THE INVENTION

The present invention pertains to amplifiers for extremely high frequency signals. Advanced communication satellites use millimeter wave or extremely high frequency (EHF) bands to obtain large channel bandwidths for high data rate transmission. Typically, travelling wave tube (TWT) amplifiers are used to produce the required output power in the millimeter wave frequency bands, due to output power limitations of solid state amplifiers. However, TWT amplifiers are large, heavy, and not as reliable as solid state amplifiers. They usually have a limited lifetime in space. High DC power consumption is a primary concern with EHF TWT's, which have power added efficiencies on the order of 10 percent. Similarly, diode amplifiers, such as Impatts or Gunn's, have even lower efficiency.

By contrast, solid state amplifiers with power added efficiencies of 30 to 40 percent can be achieved at EHF (Class B mode) using state-of-the-art hetero-junction bipolar transistor (HBT) technology. However, the output power levels of these devices at EHF are in the 20 to 100 milliwatt range, which is far too low for use as a satellite transmitter. The amount of RF output power that can be obtained from a reliable, efficient, and producible active amplifier is limited to approximately 150 MW because of thermal, space, and other constraints associated with the device when used at gigahertz (GHz) frequencies, such as 60 GHz. Thus, large numbers of devices are required to obtain signals of several watts. A commonly used type of microwave power combiner is the corporate combiner, shown conceptually in FIG. 1. In corporate combiners the RF fields follow transmission line paths as they combine (or split) in series in a binary tree. Amplifiers are bonded into each leg of the tree (requiring 128 RF bonds for a 64-way combiner). The corporate combiner may include driver amplifiers 31 on the signal input, and medium power amplifiers 33 at stages along the signal paths. High power amplifiers 35 create the amplified signal, which is then combined in the output tree.

Corporate combiners can be made in microstrip using the Wilkinson combiners circuits or in waveguide using magic tees. Output power degradation resulting from failed elements is characterized by: $P_{out} = P_{total} * (1-n/N)^2$ where N is the total number of elements, $P_{total}$ is the total power of N elements, and n is the number of failed (or noncontributing) elements. This does not correspond to graceful degradation on a one-to-one basis. A 64-way corporate combiner requires 127 waveguide magic tee sections or microstrip Wilkinson combiner sections. This limits the achievable bandwidth. Furthermore, it does not allow for higher combining levels to produce more output power.

In corporate combiners, loss is a function of the number of elements, since the combiner line lengths necessarily increase with the size of the array. The total loss is $A*L$; where A is the attenuation per unit length and L is the total path line length.

Typical corporate power combiners, such as Lange couplers or N-way Wilkinsen radial combiners, are very inefficient, especially in combining outputs from a large number of amplifiers. The high impedance transmission lines required for matching are unrealizable for large combining ratios. In addition, failure of a single amplifier causes a large degradation in combiner output power.

Another type of microwave power combiner is a spatial combiner, shown conceptually in FIGS. 2 and 3. Spatial combiners combine the fields in space rather than using transmission lines, using well known antenna principals. The fields are launched from a source 39 with a feed horn 41. A first lens 43 creates a planar phasefront, and MMIC power amplifiers 45 increase the signal level. Uniform energy fields converge to a condensed area (feed horn) 47 using a second lens 49 or a wall structure to guide the fields toward convergence.

In spatial combiners the loss is independent of the size of the array or the number of elements which are being combined. This leads to growth potential since more power can be achieved by merely increasing the size of the array. Losses are only associated with mismatch and transmission through a focusing lens or guided wall structure. Graceful degradation associated with non-contributing array elements is assured since the output power is characterized by $P_{out}32 P_{total}*(1=n/N)$. Note that in this expression the exponential factor 2 is missing.

Spatial combiners do not have the problem of a large degradation of output power due to failure of a single amplifier because the signal paths are in parallel. This principle is used widely in antenna designs. For example, random array element failure in a large array produces only a minimum effect on the antenna gain and antenna pattern. Using spatial combiner for power amplification follows well-known antenna theory. Furthermore, combining efficiency is not limited to any particular number of elements as in the case of the corporate combiners since the combining loss is almost completely independent of the number of elements.

FIG. 3 illustrates a feedthrough spatial combiner having a signal source for the entering signal. A first lens 43 creates a planar phase front for amplification by the array of MMIC power amplifiers. The second lens 49 focuses the amplified signal onto the output port 51. However, there remains the problem of dissipating the heat generated by the MMIC power amplifiers 45.

The concept of using spatial combiners for achieving high output power from a large number of amplifiers has not been widely adapted due to three major problems: 1) Heat generated by the amplifiers cannot be readily dissipated, 2) Fabrication and installation is difficult, complex, and costly, and 3) Routing RF signals to the back side of the array (where the combiner horn is located) requires bonding RF interconnections which degrades reliability and performance at EHF. The present invention resolves these deficiencies.

SUMMARY OF THE INVENTION

The present invention is a bi-directional power combiner for spatially combining millimeter wavelength signals. The invention includes a waveguide horn having a narrow end and a wide end, with the narrow end connected to receive an input millimeter wavelength signal. A plurality of amplifiers are mounted on a mounting plate across the wide end of the waveguide horn for receiving the input signal from the narrow end of the waveguide, amplifying the received signal, and returning the amplified signal toward the narrow end of the waveguide horn. A discriminator connected at the narrow end of the horn discriminates between the input signal transmitted to the wide end of the horn and the returned amplified signal. In one embodiment, the plurality of amplifiers comprises a plurality of grid oscillator amplifiers, and the discriminator comprises a circulator. In another embodiment of the invention, the system additionally includes a polarizer for providing the input signal with a first polarization, and wherein the amplified signal is returned with a second polarization, orthogonal to the first polarization, and the discriminator comprises an ortho-mode transducer for propagating the input signal having the first polarization through the horn, and directing the amplified signal having the second polarization into an output port.

DETAILED DESCRIPTION OF THE PREFERRED EMBODIMENT

Bi-directional Ortho-mode Spatial Power Combiner Amplifier

Figure 1:
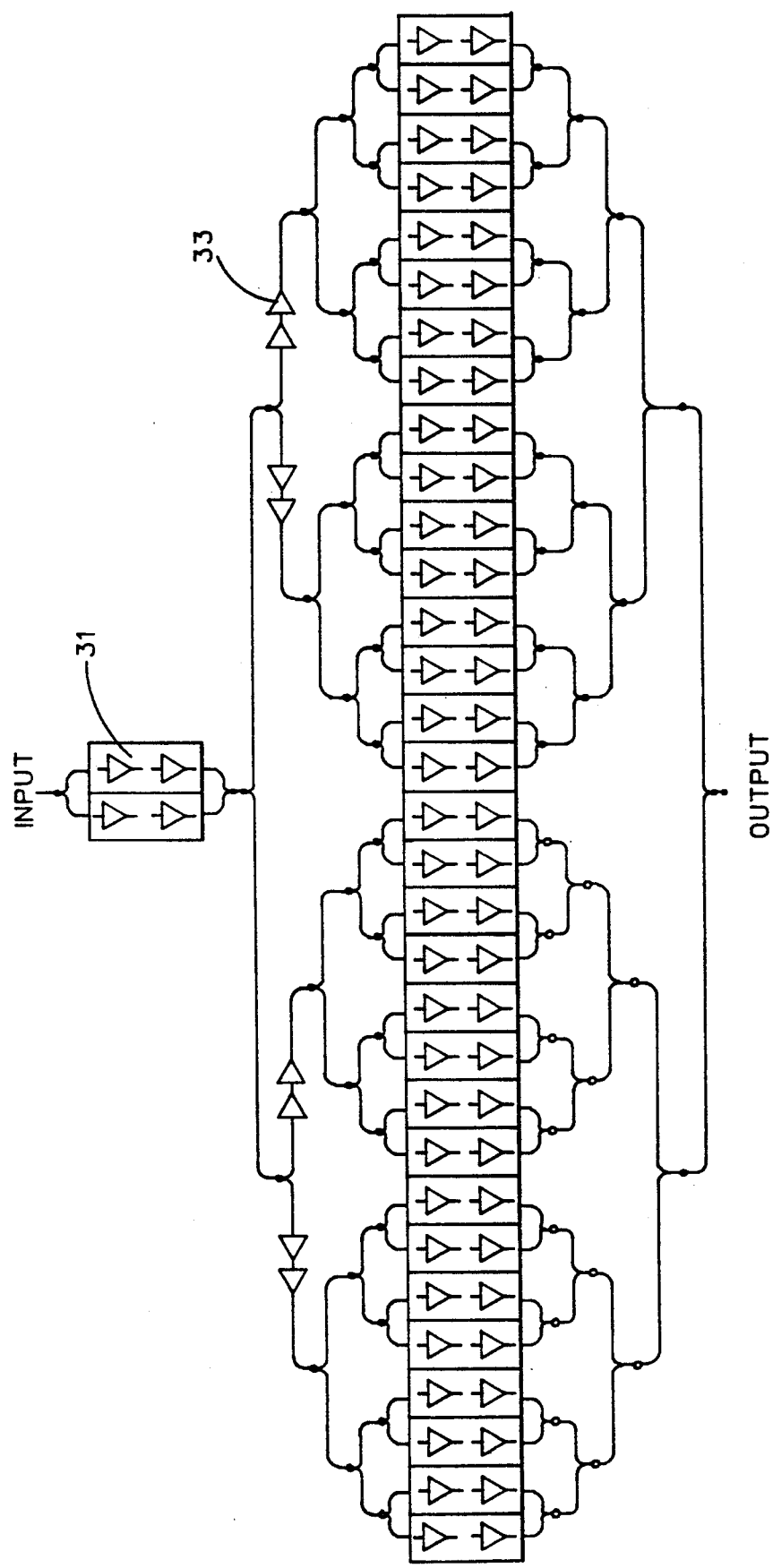
FIG. 1 illustrates conceptually a Wilkinson Microstrip corporate power combiner.
Figure 2:
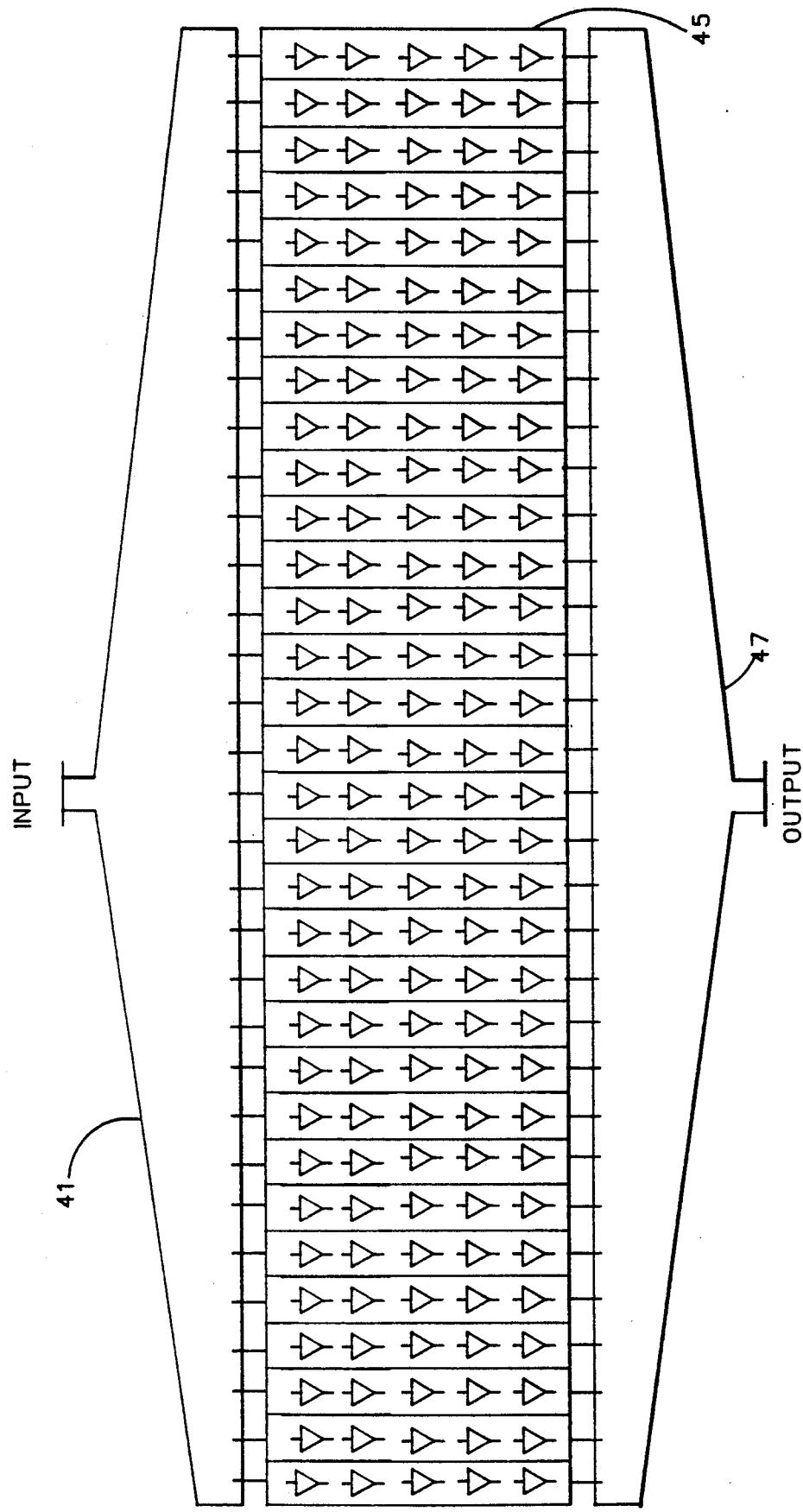
FIG. 2 illustrates conceptually a spatial power combiner.
Figure 3A:
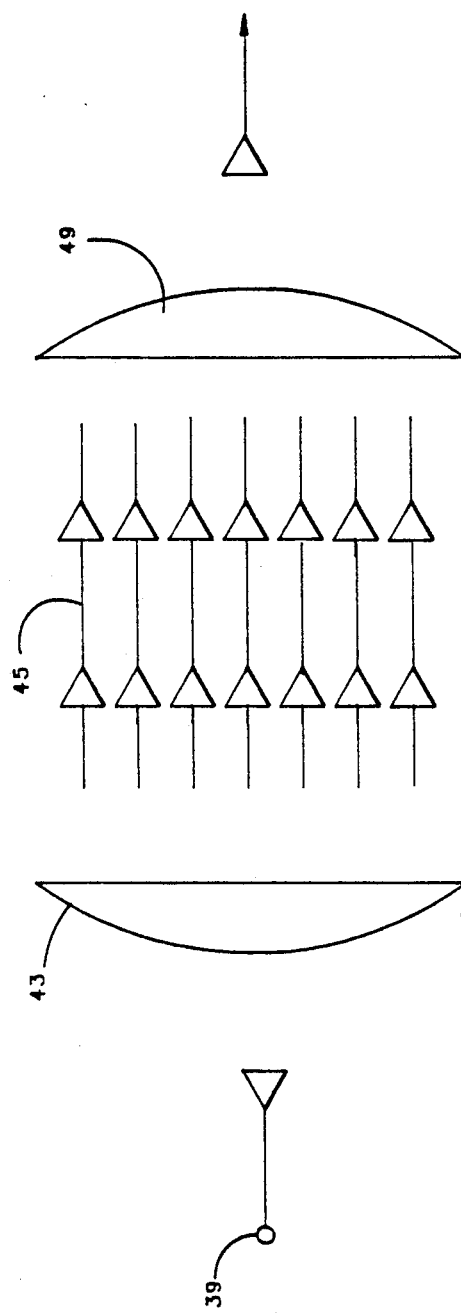
FIGS. 3a & 3b illustrate a feedthrough spatial power combiner.
Figure 3B:
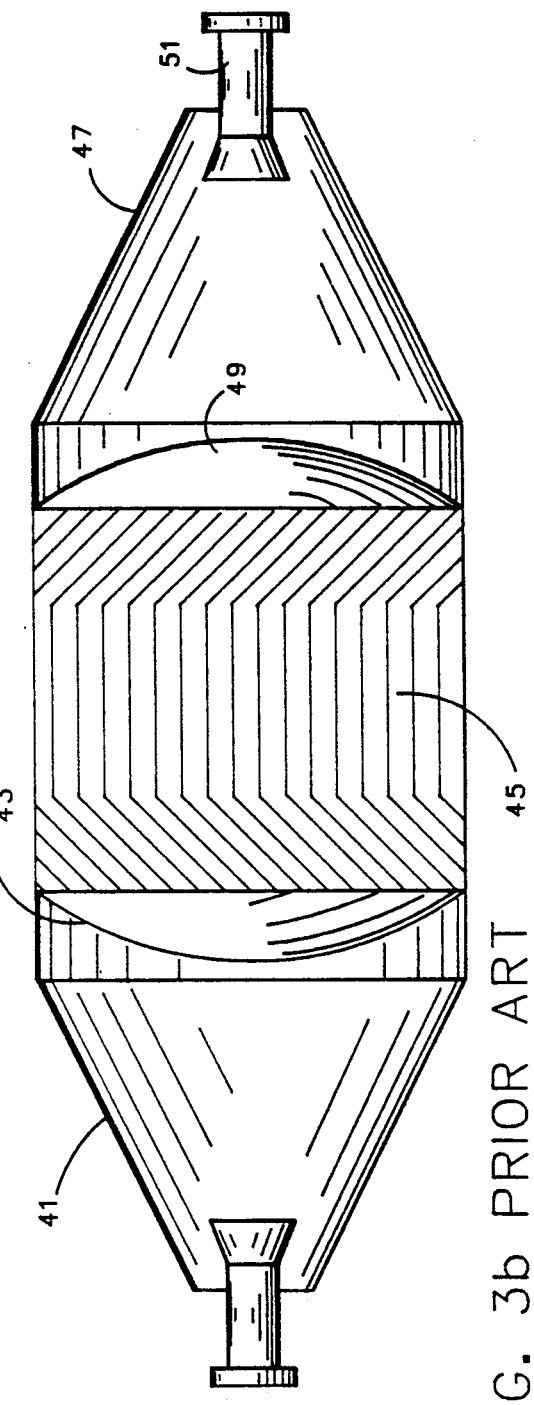
Figure 4:
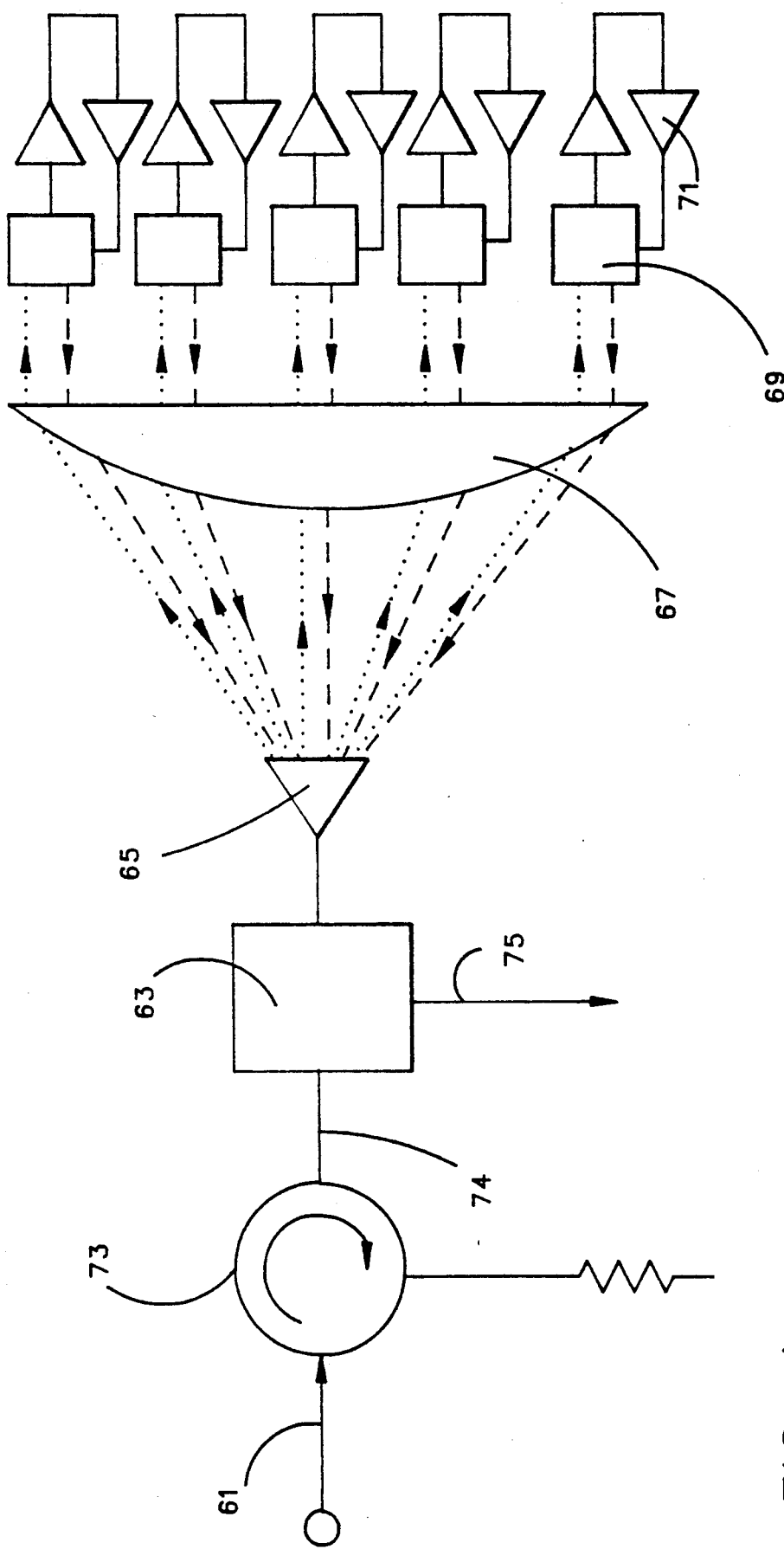
FIG. 4 is a schematic illustration of a preferred embodiment of the ortho-mode spatial power combiner.

A preferred embodiment of the present invention is depicted schematically in FIG. 4. As illustrated, the amplifier includes a signal input 61 for receiving a vertically polarized signal, an ortho-mode transducer 63 feeding a transmission horn 65, a dielectric lens 67, and an array of ortho-linear polarization elements 69 with monolithic amplifiers 71. An input circulator 73 having an RF load may be used to improve the source impedance match.

A signal enters the vertical polarization port 74 of the ortho-mode transducer 63 and propagates through the horn 65 and through the dielectric lens 67, which focuses a vertically polarized plane wave signal onto the planar, monolithic array of amplifiers 71 that are connected to ortho-linear polarization radiating elements 69. These signals are picked up by the vertically polarized receive radiating elements in the array, amplified, and re-transmitted back to the horn 65 via horizontally polarized radiating elements. The output signal emerges at the orthogonal horizontal port 75 of the ortho-mode transducer 63.

Figure 5:
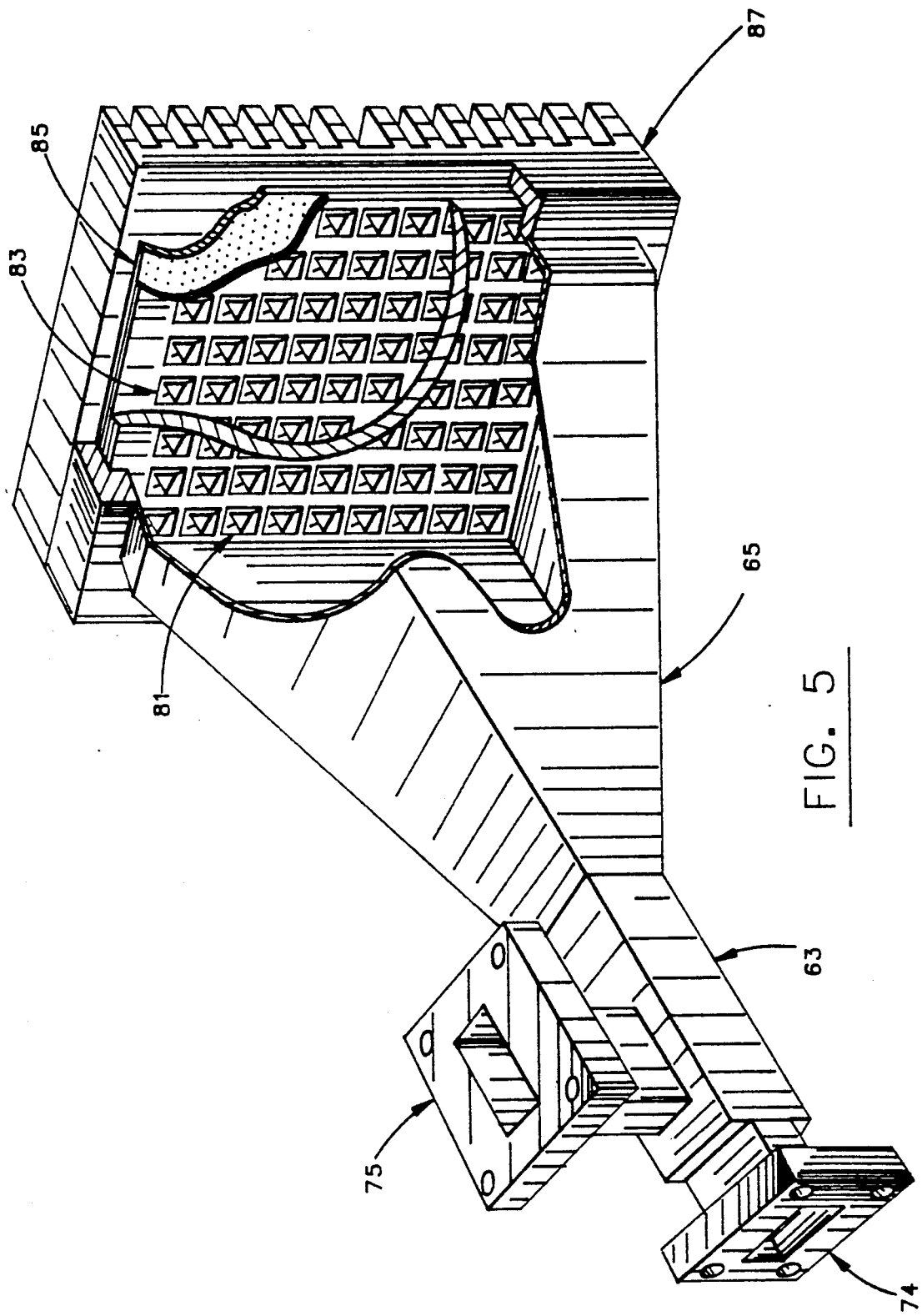
FIG. 5 is an isometric view, partially in cross-section, of one embodiment of the spatial power combiner of the invention.
Figure 6:
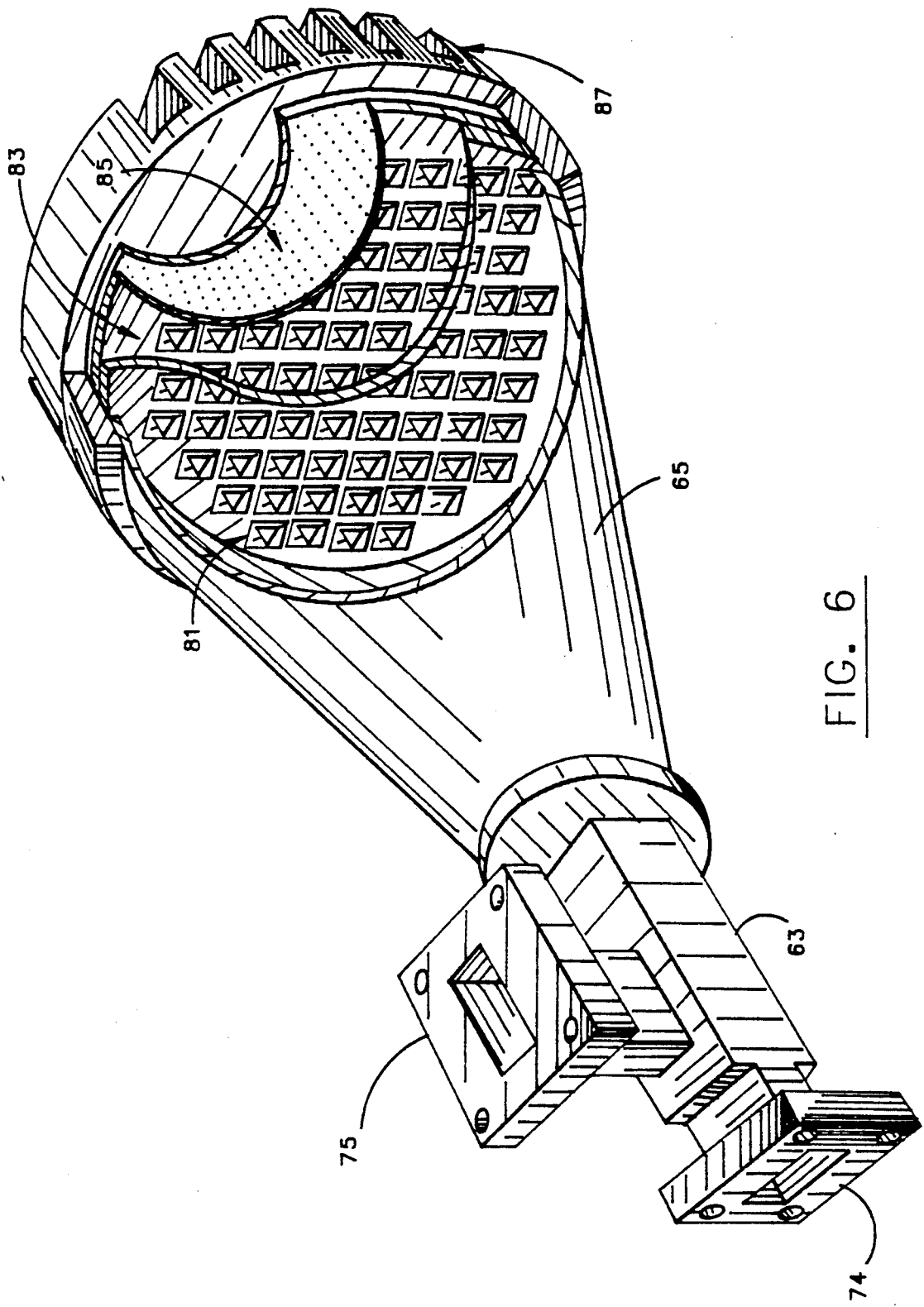
FIG. 6 is an isometric view, partially in cross-section, of a second embodiment of the spatial power combiner of the invention.

FIGS. 5 and 6 are isometric views of the ortho-mode spatial power combiner in rectangular and circular configurations, respectively. In these views, the ortho-mode transducer 63 is visible with the input port 74 for receiving the vertically polarized low-power input signal and the output port 75 for the high-power horizontally polarized signal. The transmission horn 65 is coupled between the transducer 63 and the antenna arrays. In the illustrated embodiments, the monolithic power amplifiers with ortho-linear polarization active antenna elements on a GaAs substrate have an array 81 of parasitically excited antenna elements on a dielectric substrate. The array 83 of monolithic power amplifiers with the active antenna elements is shown mounted on a multi-function integration plate 85 with multi-layer DC power interconnects, which is in turn mounted on a heat sink 87.

Figure 7:
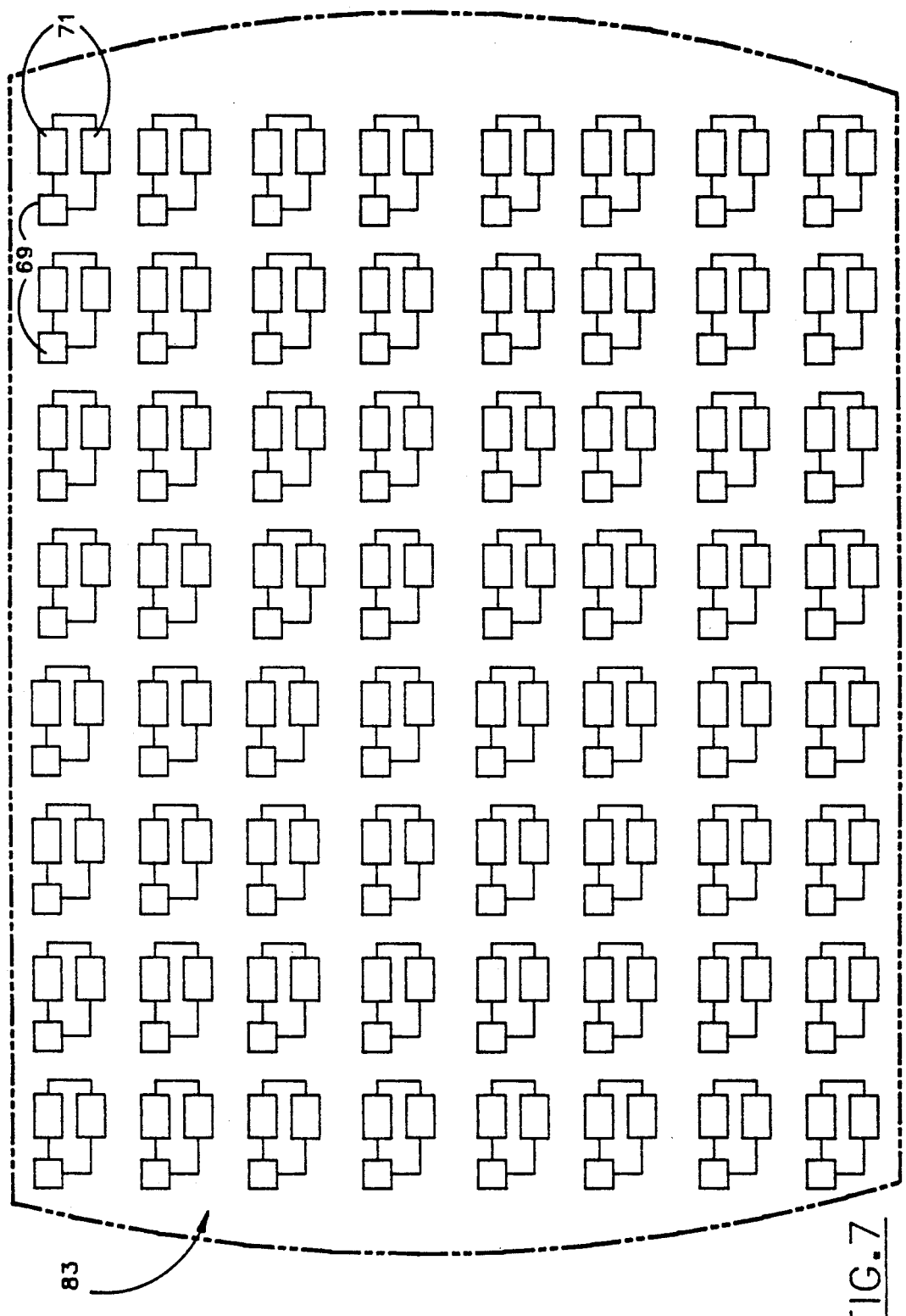
FIG. 7 illustrates an array of ortho-linear antenna elements and associated amplifier elements for use in the ortho-mode embodiment of the invention.

FIG. 7 shows an array of amplifier elements 71 with ortho-linear radiating elements 69.

Although the preferred embodiment of the invention is described as using orthogonal vertical and horizontal polarizations, other polarizations that cause the entering electromagnetic waves and the amplified electromagnetic waves to be substantially non-interfering may be used.

The bi-directional power combiner of the invention has several advantages at millimeter waves over other spatial combining approaches and over corporate combining approaches. Compared to transmission (feedthrough) type spatial combiners, the invention has half the size and weight. More importantly, it resolves the difficulty of removing the heat generated by a very large number of densely packed power amplifiers. The entire backside of the wafer can be mounted to a good heat sink. Moreover, the backside provides an easy access to DC bias points on a monolithic array through via holes incorporated in the monolithic process. Having the radiating elements as part of the amplifier circuitry eliminates all RF interconnections which are necessary in the through-type optical combiners. Thus the amplifier array can be monolithically integrated for better reliability and lower costs. Compared to the corporate combiner, the invention is much more efficient, having lower RF insertion loss when used to combine outputs from large numbers of amplifiers. The power amplifier of the invention uses spatial combining where the network losses are nearly independent of the number of elements to be combined.

The output power depends on the size of the array and the power output of the individual amplifiers. Theoretically, output power levels of 10 to 30 watts can be achieved in the 20 to 60 GHz range with a 4 inch square array using state-of-the-art heterojunction bipolar transistor (HBT) technology.

Figure 8:
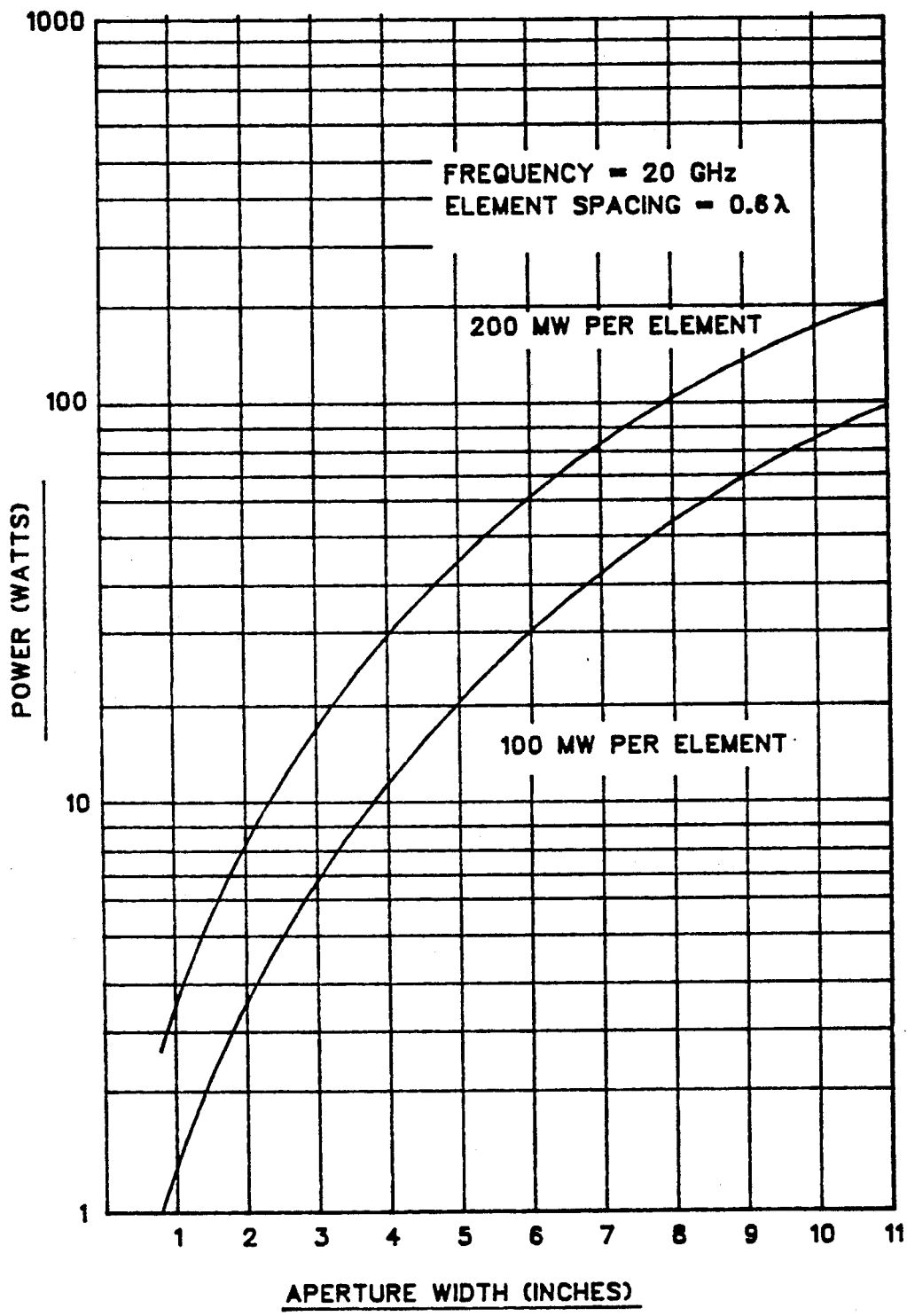
FIG. 8 is a plot of theoretical power output as a function of aperture width.
Figure 9:
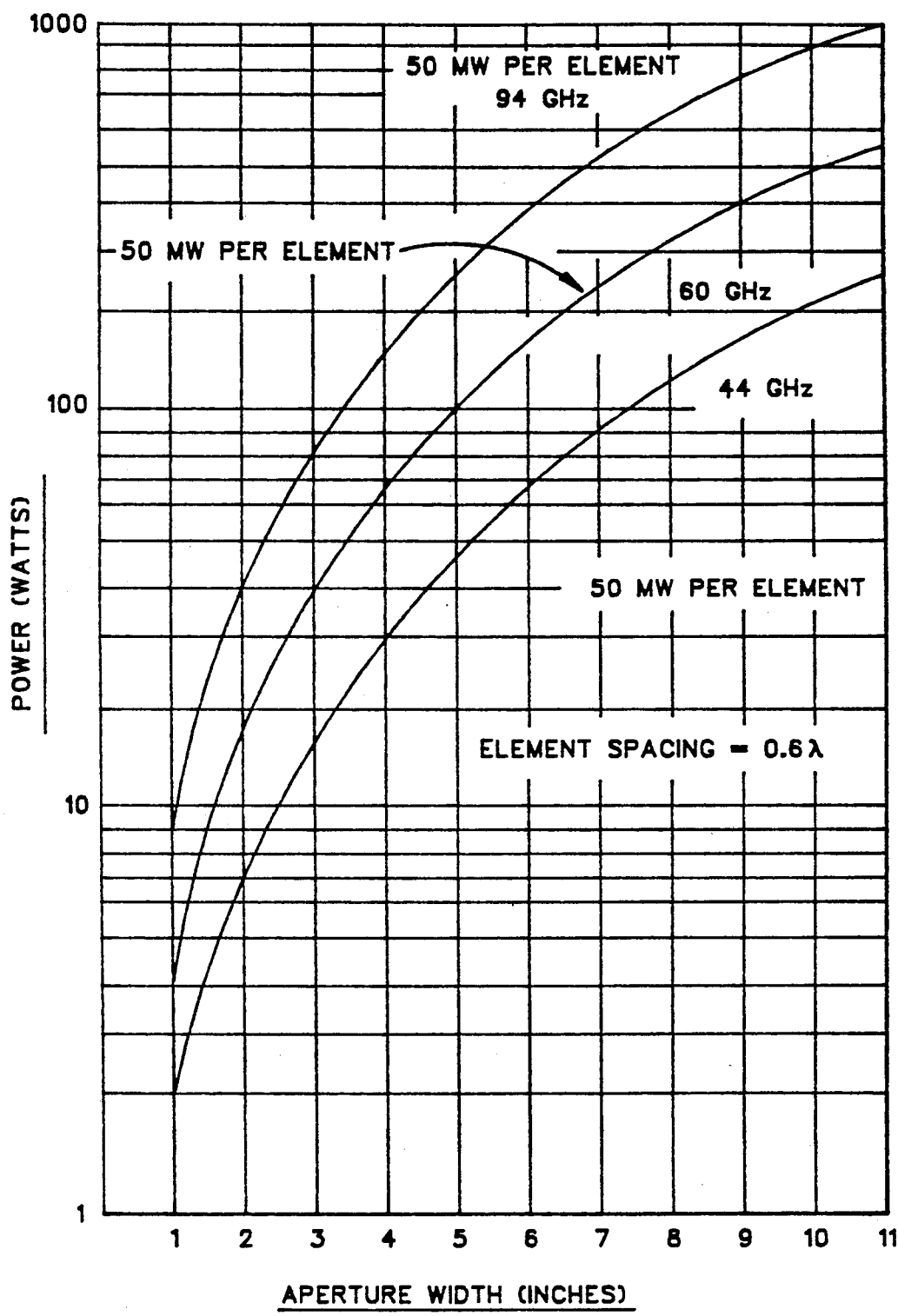
FIG. 9 is a plot of theoretical power output as a function of aperture width for signals of different frequencies.
Figure 10:
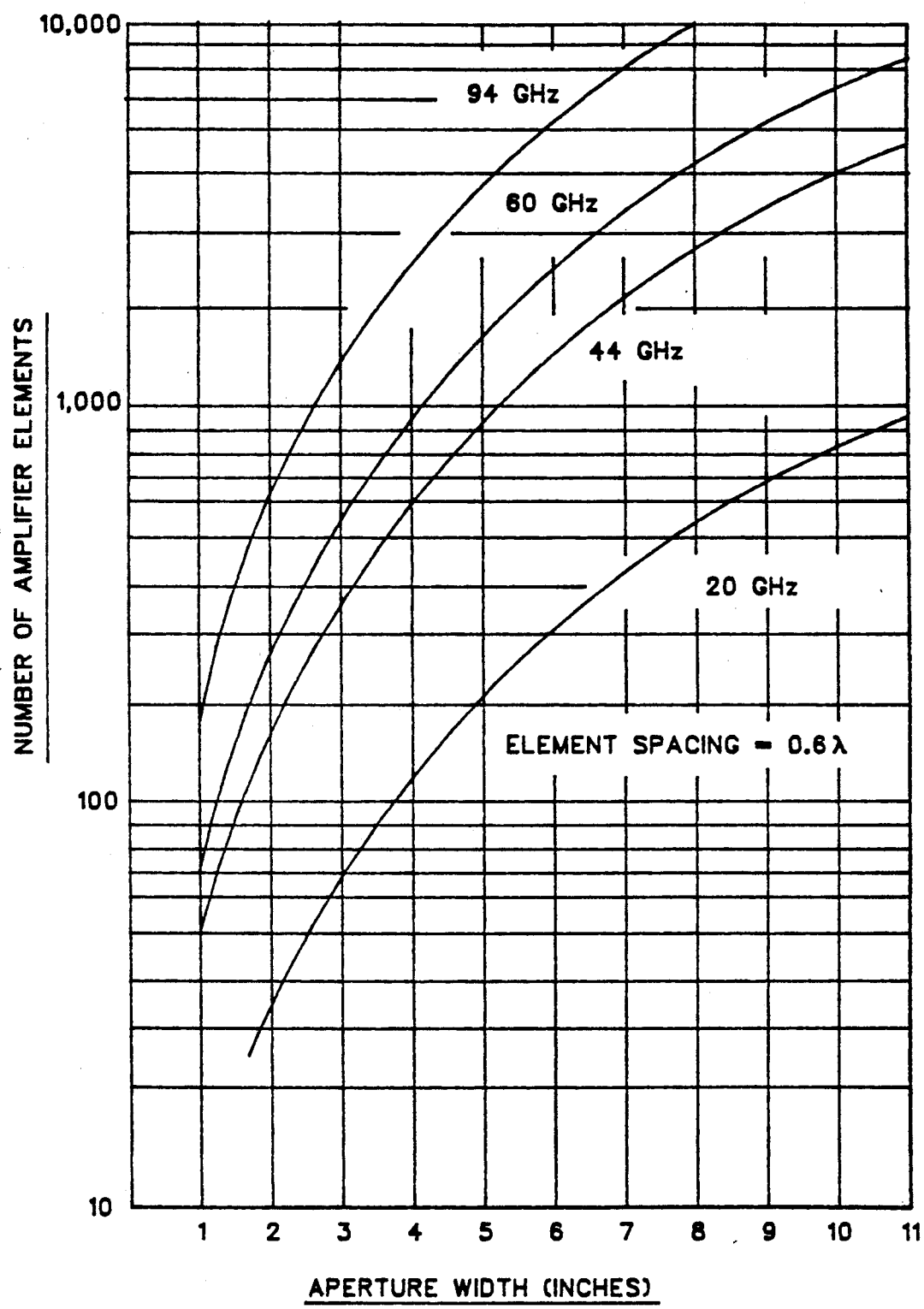
FIG. 10 is a plot of the number of amplifier elements as a function of aperture width for signals of different frequencies.

Larger arrays or higher amplifier power output may provide an even higher power output since the combining efficiency is relatively independent of array size or amplifier power. FIG. 8 shows the theoretical power output (with no combining loss) at 20 GHz as a function of aperture width in inches using 100 and 200 milliwatt amplifier elements spaced by approximately 0.6 wavelength. Similarly in FIG. 9, the theoretical output power is plotted for 44, 60 and 94 GHz operation as a function of aperture width using amplifier elements with 50 milliwatt power outputs. FIG. 10 shows the theoretical relationship between the maximum number of elements and the aperture width at three millimeter-wave frequencies. These curves demonstrate the potential for extremely high output power at EHF bands using amplifiers with only low or moderate power levels.

Figure 11:
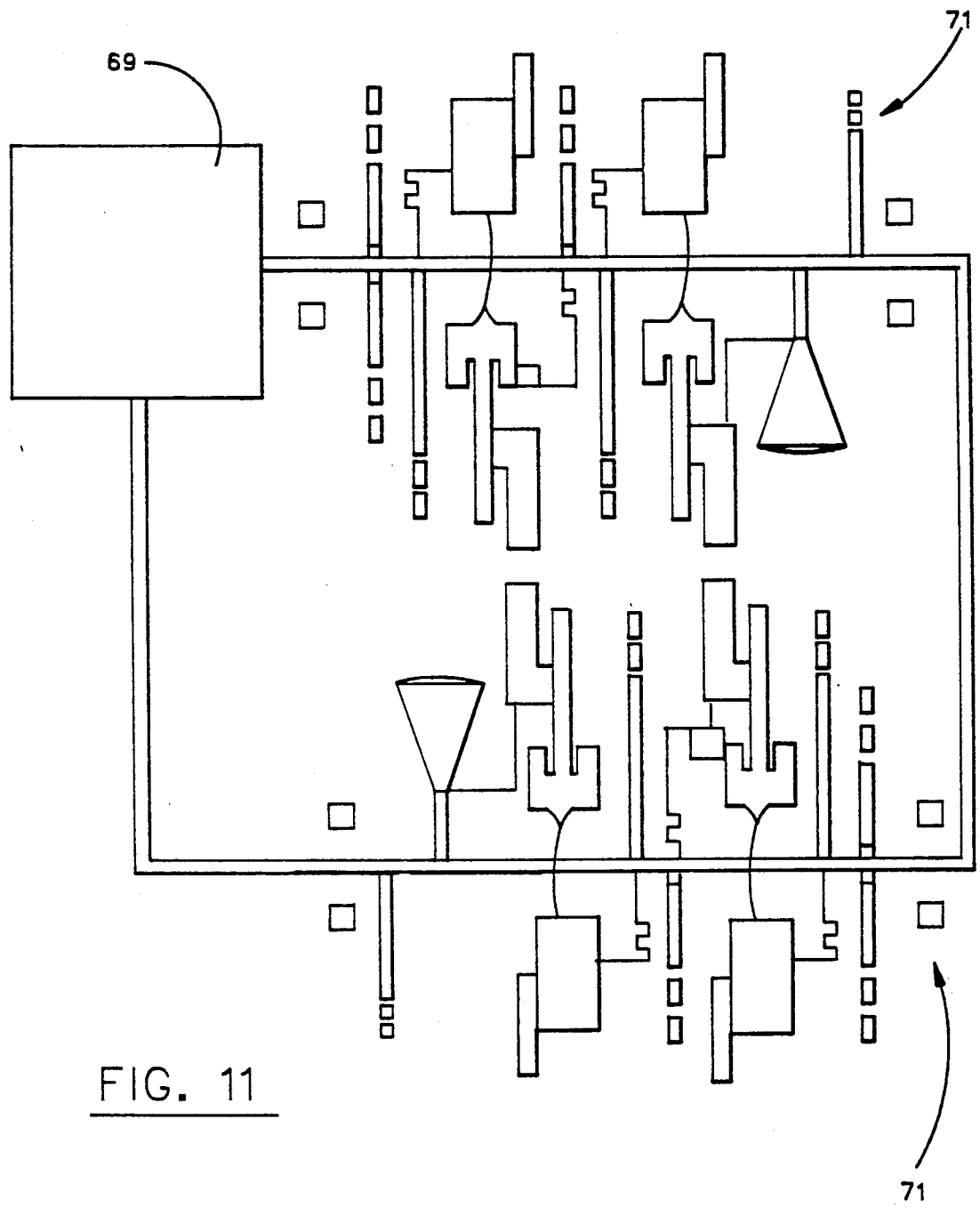
FIG. 11 illustrates a power amplifier element with an ortho-linear polarization radiating element.
Figure 12:
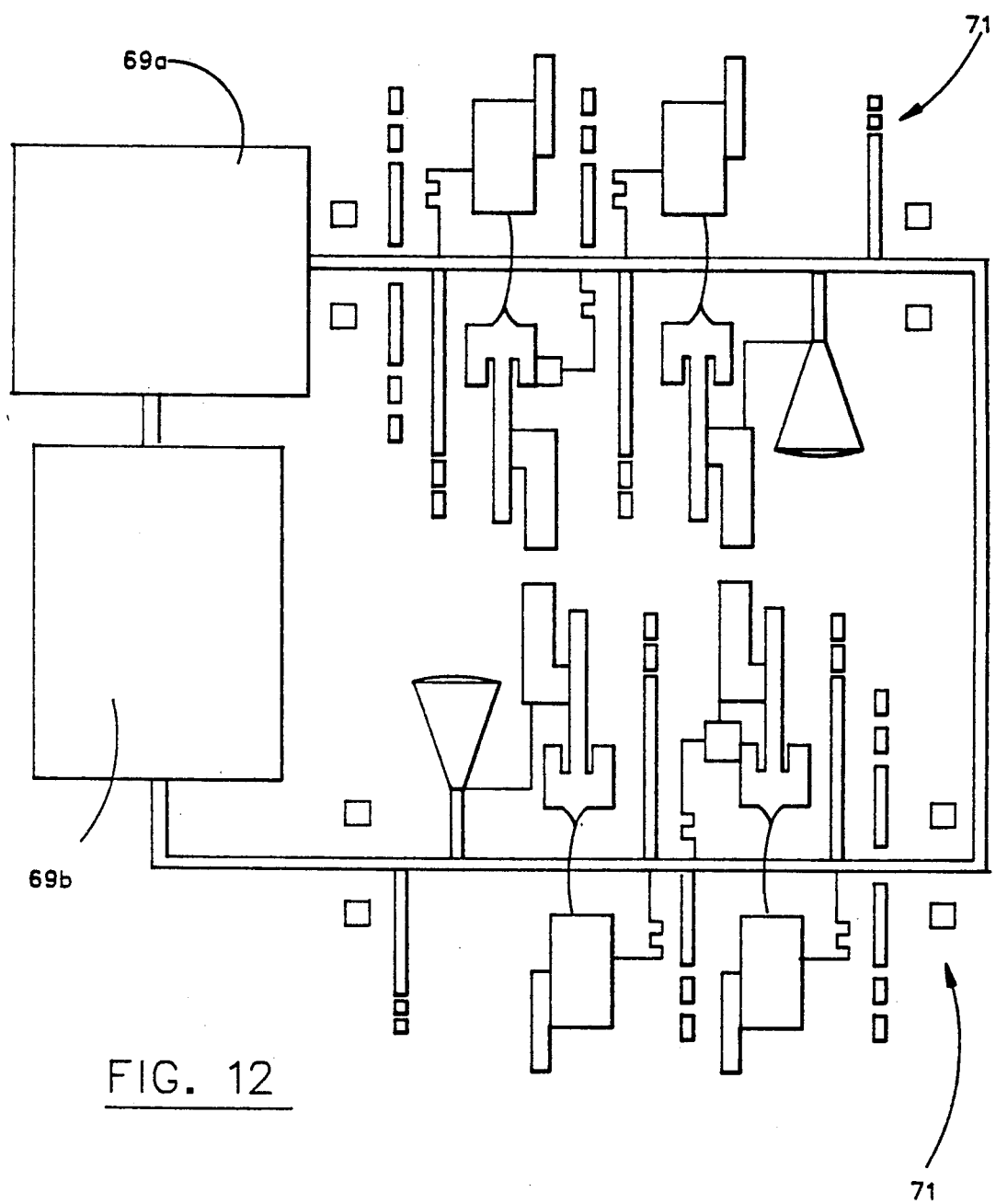
FIG. 12 illustrates a power amplifier element with separate receive and send radiating elements.

One important design criteria for the amplifier of the invention is that the isolation between the vertically and horizontally polarized signals must be greater than the RF signal gain of the amplifiers at all frequencies to avoid the possibility of oscillation. The cross polarization isolation requirement is achievable since commercially available ortho-mode transducers (OMT's) have over 40 dB isolation and stacked micropatch ortho-linear polarization radiating elements having greater than 25 dB isolation have been fabricated and measured. Two types of micropatch radiators are depicted in FIGS. 11 and 12 respectively. The micropatch ortho-linear polarized radiating element shown in FIG. 11 includes a single antenna element 69 for receiving the vertically polarized wave and radiating a horizontally polarized amplification of the received signal. Tests indicate that at 2-3 GHz, the radiator shown in FIG. 11 has a 25 dB isolation over a 15 percent bandwidth and a 10 dB return loss over a 10 percent bandwidth. The non-contacting ortho-linear radiator shown in FIG. 12 may provide a greater amount of polarization isolation. This embodiment has a receiving element 69a for receiving the vertically polarized signal, and a separate radiating element 69b for radiating the amplified signal as a horizontally polarized wave.

To maximize power combiner efficiency, both the total insertion loss and the total return loss (VSWR) should be minimized. The electric field must be matched both in amplitude and phase at the horn aperture. The optimum design requires a uniform amplitude and phase distribution.

The insertion losses can be minimized by proper selection of materials and fabrication processes, as will be understood by those skilled in the art. The return loss can be minimized by careful engineering and design of each component individually and collectively in the power combiner assembly, as also understood by those skilled in the art. A uniform phase distribution can be achieved with a dielectric lens inserted in front of the array and near-uniform amplitude distribution can be obtained using proper dielectric loading and/or corrugations at the sides of the horn as demonstrated in G. N. Tsandoulas, "Propagation in Dielectric-Lined Square Waveguide"; IEEE Trans. On MTT; MTT-23, No. 5, May 1975; pp 406–410, and S. F. Mahmond, "Propagation and Radiation Behavior of a Longitudinally Slotted Horn with Dielectric-Filled Slots," IEEE Proceedings, Vol. 132, Pt H, No. 7, December 1985.

Figure 13:
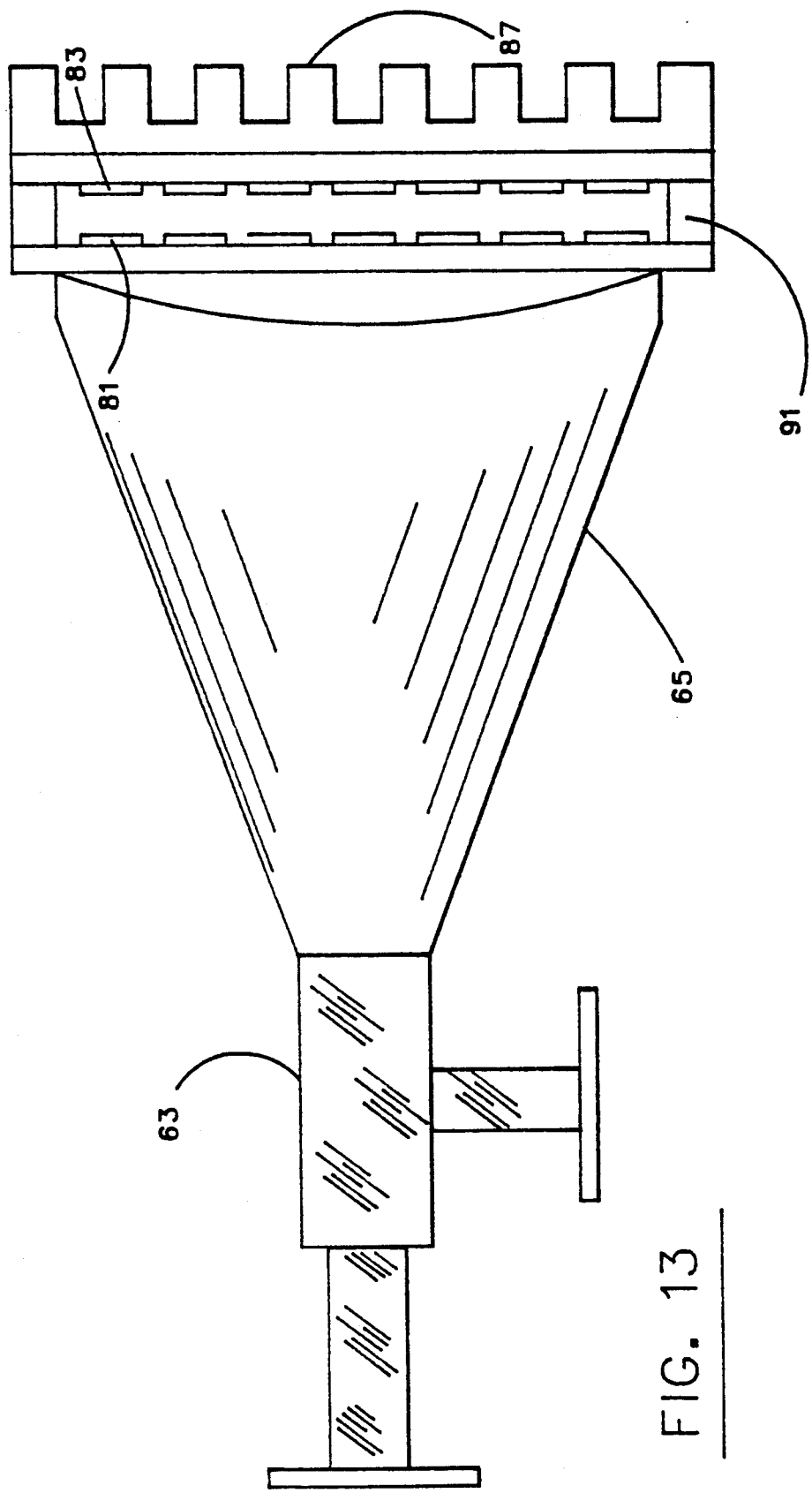
FIG. 13 is a longitudinal cross section of an amplifier constructed according to one embodiment of the invention.

The system of the invention is shown in cross-section in FIG. 13. Visible are the active elements 83 and the parasitic elements 81 separated by a spacer 91.

Figure 14:
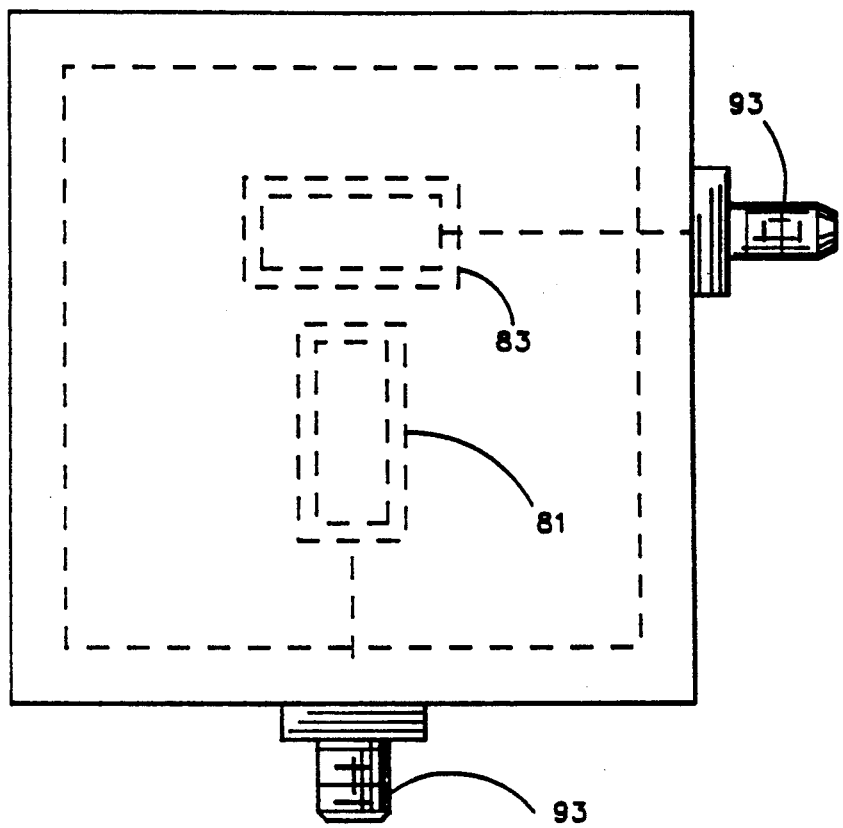
FIG. 14 is a plan view of the radiating elements of a single amplifier element.
Figure 15:
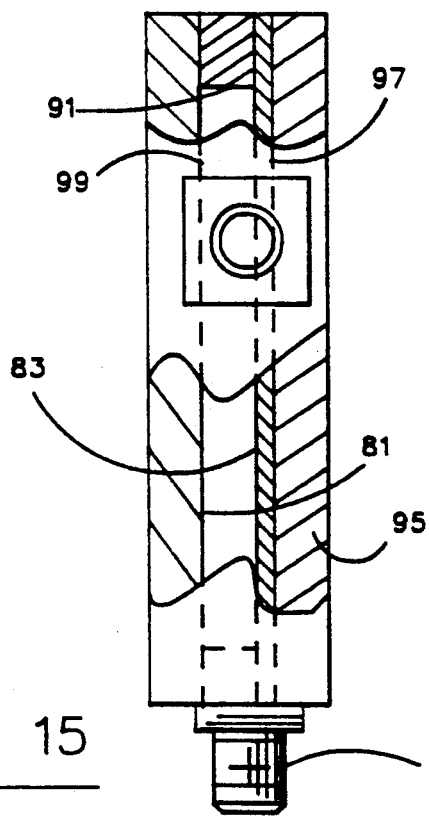
FIG. 15 is a cross-sectional view of the radiating elements of a single amplifier element.

FIG. 14, illustrating a single stacked micropath element, shows the active elements 83 and their corresponding parasitic elements 81. An SMA connector 93 is provided for each active element. The single stacked element is shown in cross-section in FIG. 15. Seen in FIG. 15 is the metallic support 95, the active element support dielectric 97, and the parasitic element support dielectric 99.

Figure 16:
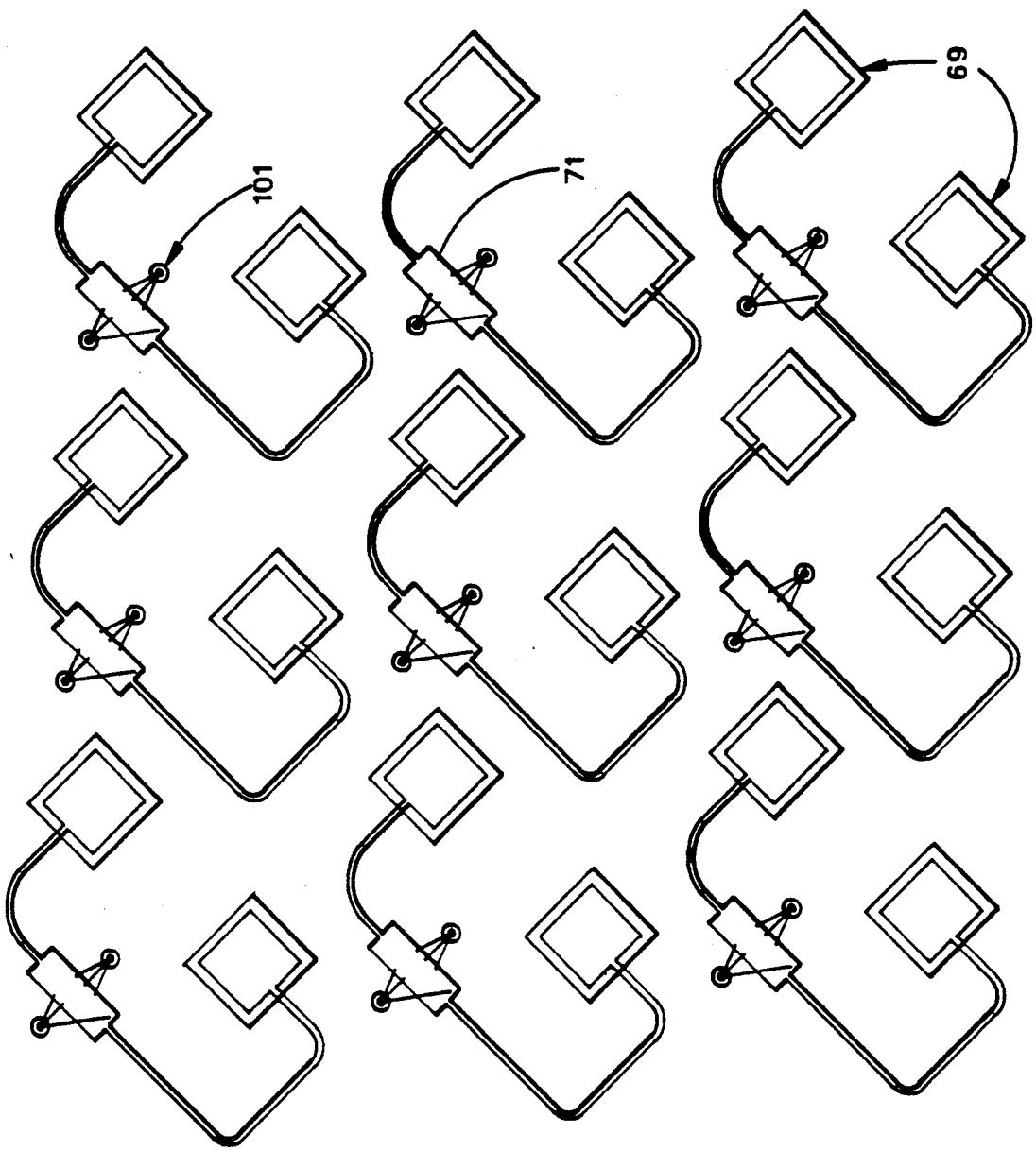
FIG. 16 is a diagram of a typical orthogonal polarization active array in a square lattice.

The bi-directional ortho-mode spatial power combiner amplifier assembly of the invention is completed by integrating the ortho-mode combiner assembly (consisting of the ortho-mode transducer (OMT), the dielectrically loaded longitudinally slotted circular feed horn, the dielectric phase correction lens, and the active array assembly (consisting of monolithic amplifier chips integrated in a microstrip patch array, a parasitic micropatch array, and a heat sinking carrier plate). A typical orthogonal polarization active array in a square lattice is shown in FIG. 16. This lattice includes ortholinear polarization radiating elements 69 and power amplifiers 71. DC bias lines 101 are seen connected to the power amplifiers.

Figure 17:
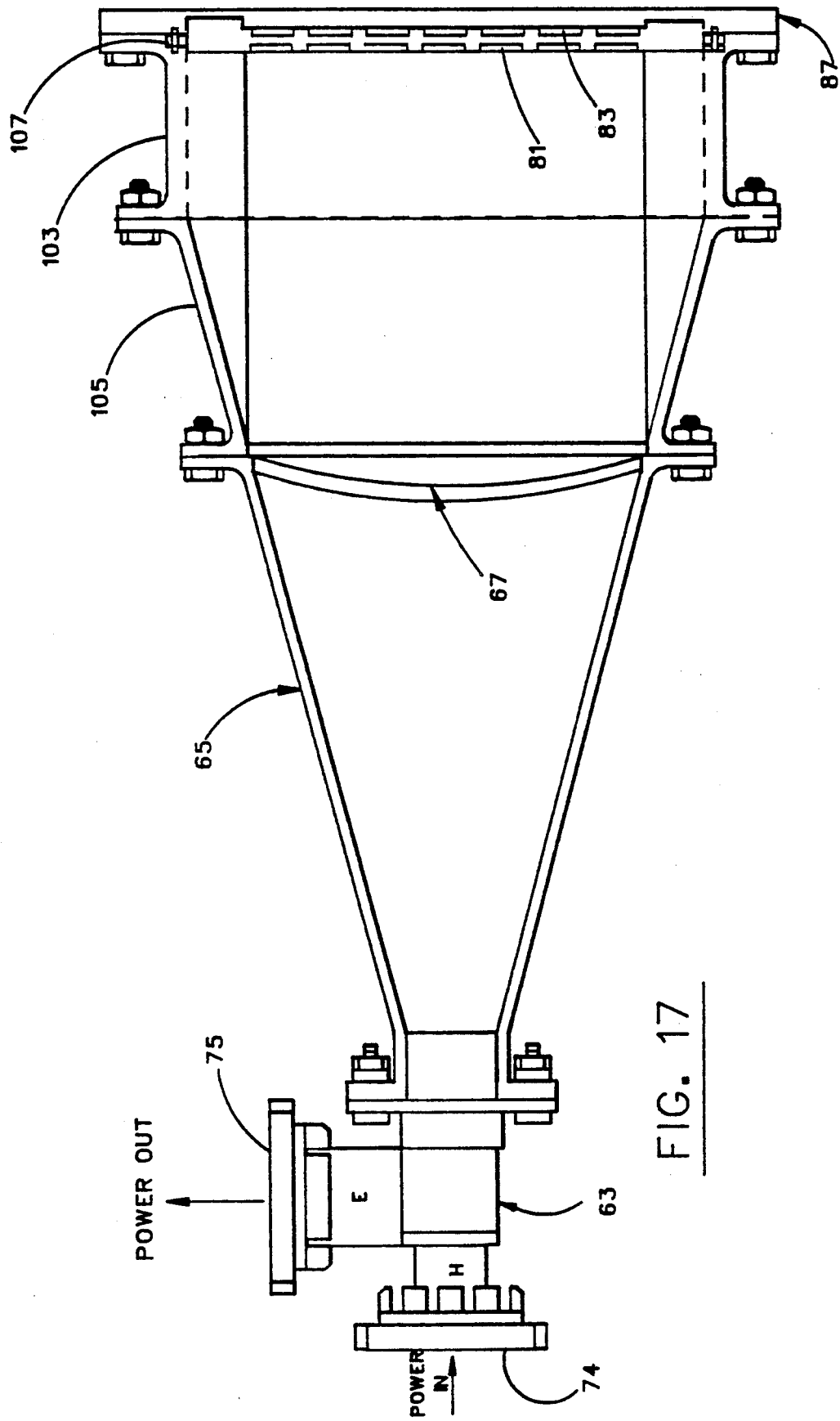
FIG. 17 is a cross-sectional view of an embodiment of the spatial power combiner of the invention.

FIG. 17 is another cross-sectional view of a spatial power combiner constructed according to the invention. Power enters the input port 74 of the ortho-mode transducer 63. The signal is propagated through the conical horn 65 to the dielectric lens 67. The array 81 of parasitic micro-patch elements is spaced from the array 83 of driven (active) micro-patch elements and amplifiers on a substrate. These elements are mounted on a base plate and heat sink 87 at one end of a congitudinally slotted cylindrical horn 103. A conical cover 105 for the longitudinal slots provides the transition between the conical horn 65 and the longitudinally slotted cylindrical horn 103. A parasitic retaining ring 107 holds the array 81 of parasitic elements in the proper spatial relationship with respect to the array 83 of active elements.

Bi-Directional Spatial Power Combiner Oscillator Amplifier

Figure 18:
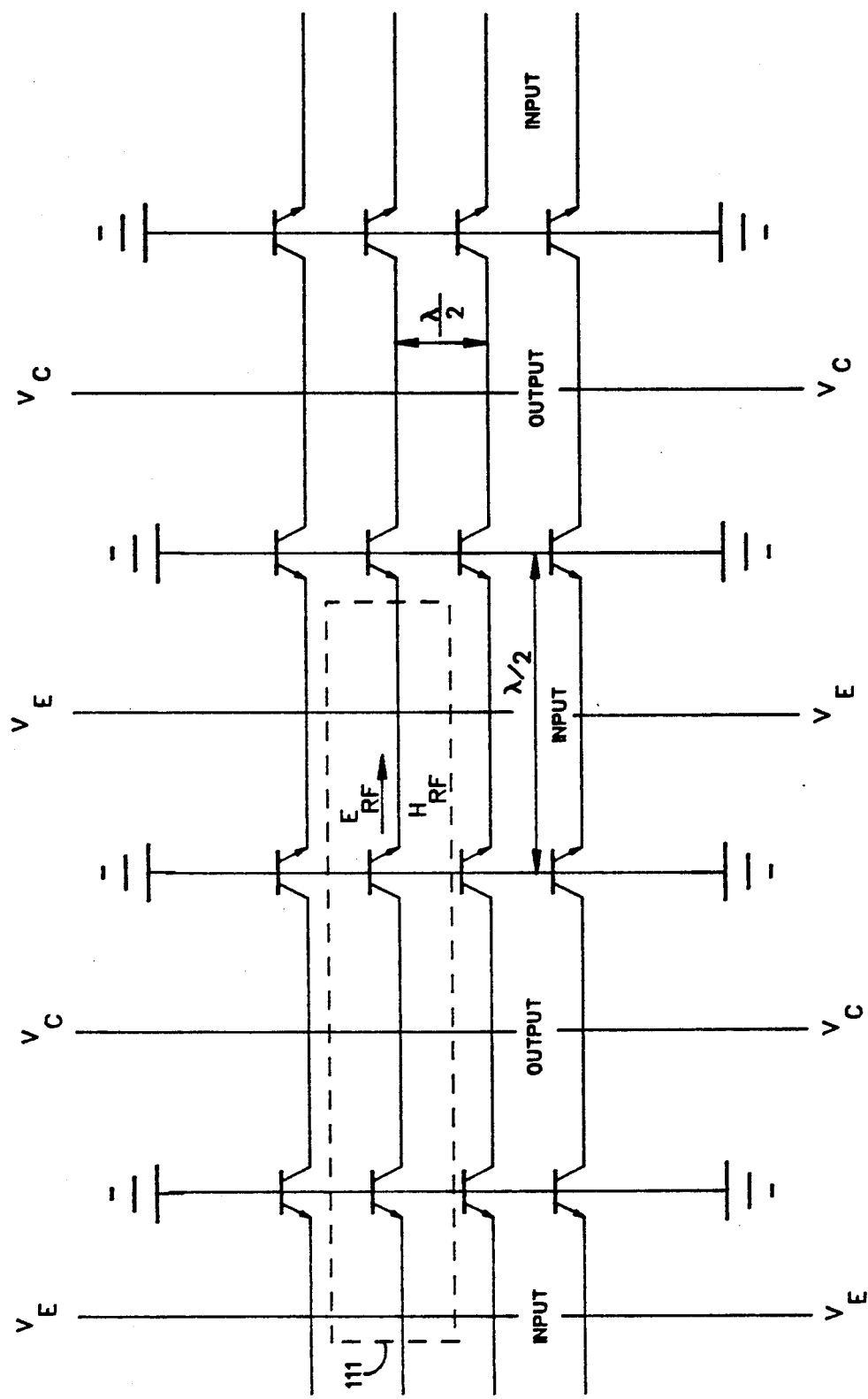
FIG. 18 is a schematic diagram of a grid oscillator and amplifier HBT grid arrangement for use in another embodiment of the signal amplifier of the invention.
Figure 19:
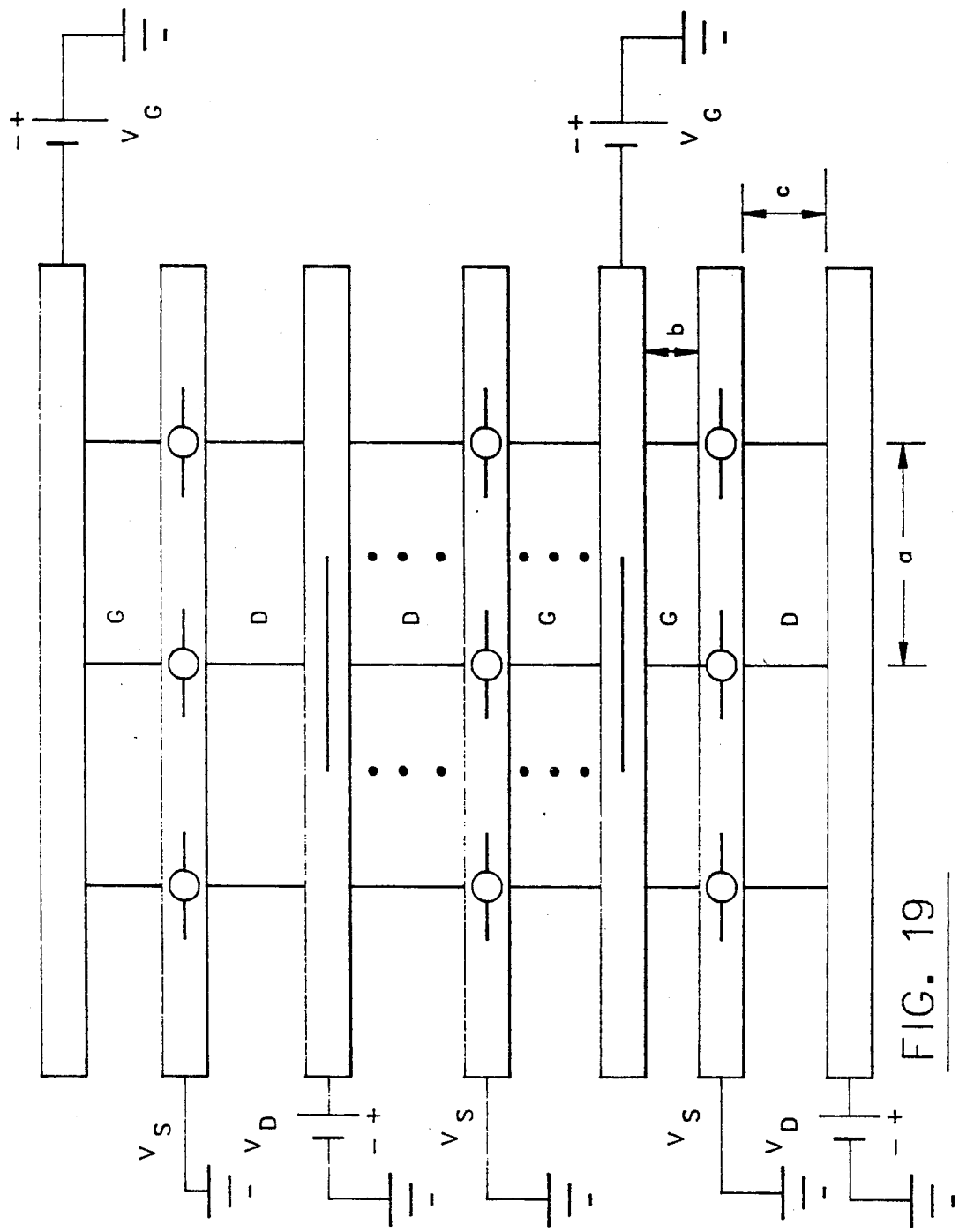
FIG. 19 is a diagram of the interconnection of MESFET's in an amplifier mirror arrangement for use in the present invention.

Monolithic grid oscillators can be used in lieu of the power amplifier elements previously described. A schematic of such a grid oscillator amplifier array is illustrated in FIG. 18, representing the interconnection of many common based HBTs using a grid structure. An individual unit cell waveguide 111 is indicated on the drawing. The devices are oriented with respect to the E and H field so that the H field will induce current in the base leads. Current will flow in the collector leads and power will be amplified by the common base mechanism of impedance transformation. An output wave will be reradiated from the collector leads. All the devices are connected as shown to work together in the uniform E and H fields, i.e., they will work to intercept or generate a plane wave with a broad front (the extent of the array). As shown in FIG. 19, they are also connected in such a way that the failure of any one device will not take out a complete row (providing that it fails open circuit as can be contrived).

Referring to FIG. 19, boundary conditions on the symmetry lines define the unit cell. The solid lines on top and bottom represent electric walls, and the dashed lines on the sides magnetic walls. Adjacent rows share drain and gate biases.

Figure 20:
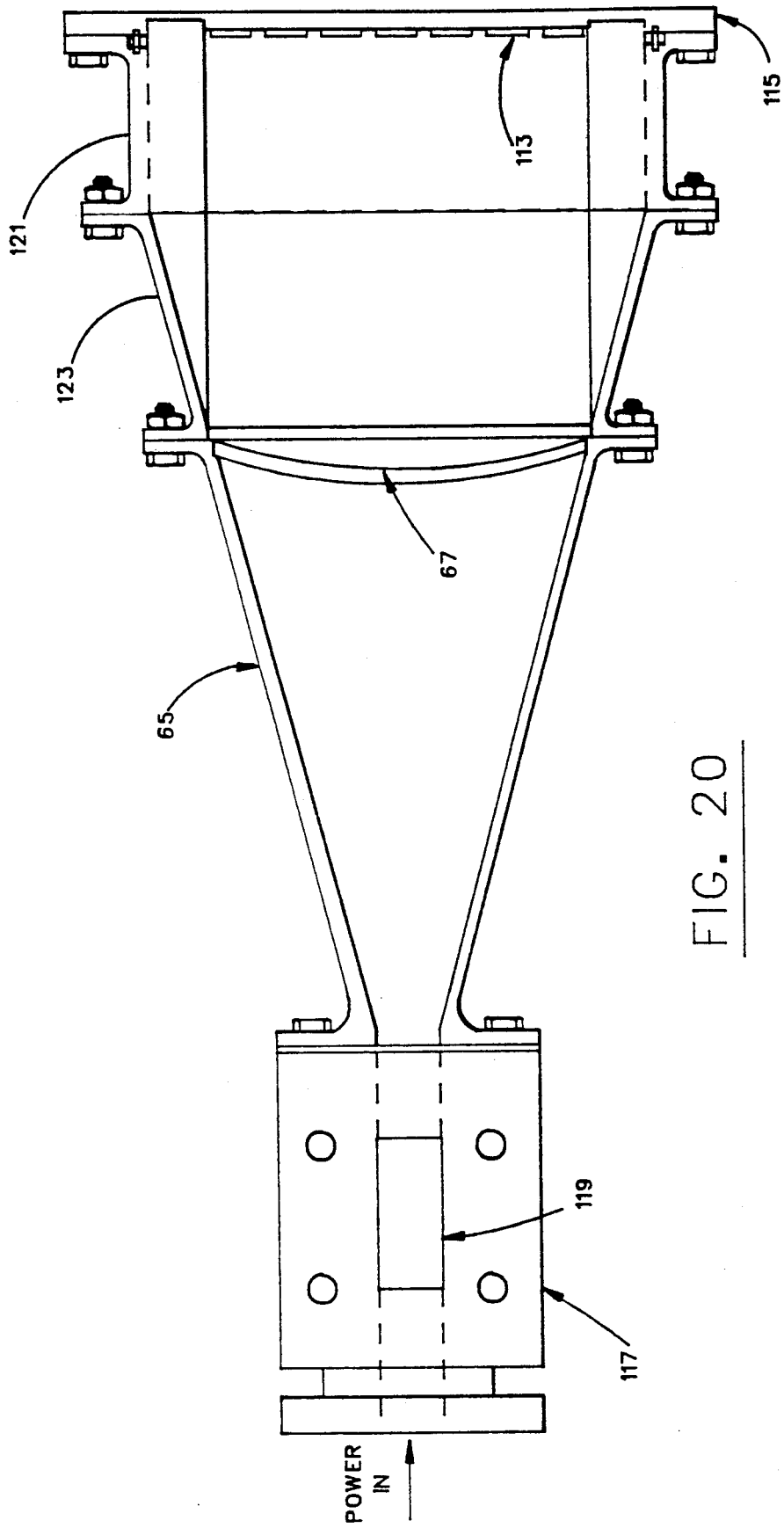
FIG. 20 is a cross-sectional view of the amplifier of the invention incorporating grid oscillator amplifiers.

FIG. 20 illustrates the system of the invention incorporating grid oscillator amplifiers. The grid oscillator amplifiers 113 are mounted on one quarter wavelength thick substrate, which in turn is mounted on a conducting (metal) base plate 115. If the substrate for the grid oscillator amplifiers is less than one quarter wavelength thick, the substrate may be bonded to a layer of dielectric material having high thermal conductivity, such as aluminum nitrite, so that the thickness of the substrate and dielectric together is one quarter wavelength.

The feedback power for the grid oscillator amplifiers may be provided by the impedance mismatch of the collimating dielectric lens 67.

Using the grid oscillator amplifiers, the polarization of the input signal and the amplified (output) signal are the same. Thus, the ortho-mode transducer of the embodiment shown in FIG. 4 is not required. A circulator 117 is used to discriminate between the input and output signals, and the loaded port 119 of the circulator becomes the RF output port.

A longitudinally slotted cylindrical horn 121, preceded by a conical cover 123 for the longitudinal slots, is used in the illustrated embodiment, although other horn configurations may also be used.

The thermal design is an important aspect in the overall design of the amplifier system. To avoid excessive heat buildup in the HBT devices, the devices should have adequate heat sinking to ensure the device reliability. In addition to adequate heat sinking, the material that the GaAs MMIC substrate mounts to must also have similar thermal expansion properties to avoid induced thermal stresses due to temperature variations.

In the thermal design, the GaAs MMIC substrate is soldered to a low temperature ceramic (LTC) substrate which is in turn soldered to a composite sheet of copper-molybdenum-copper. The selection of the materials used in this design were based primarily on thermal expansion properties.

From the above description, those of ordinary skill in the art may construct the invention. However, those skilled in the art will also recognize that certain modifications and adjustments may be made, without departing from the spirit of the invention. Therefore, the scope of the following claims is not to be limited to the specific embodiment described above.

I claim:

1. A power combiner for millimeter wavelength signals; the power combiner comprising:
    a waveguide horn having a narrow end and a wide end, wherein said narrow end is adapted to receive an input millimeter wavelength signal;
    amplifying means mounted on a mounting plate across the wide end of said waveguide horn for receiving said input signal from said narrow end of said waveguide, amplifying said received signal to produce an amplified signal, and returning said amplified signal toward said narrow end of said waveguide horn; and
    a discriminator connected at the narrow end of said horn for discriminating between said signal transmitted to said wide end of said horn and said returned amplified signal.

2. The power combiner of claim 1, wherein said amplifying means comprises a plurality of grid oscillator amplifiers.

3. The power combiner of claim 2, wherein said discriminator comprises a circulator.

4. The power combiner of claim 1, additionally comprising a polarizer for providing said input signal with a first polarization, and wherein:
    said amplifying means returns said amplifying signal with a second polarization, orthogonal to said first polarization; and
    said discriminator comprises an ortho-mode transducer for propagating said input having said first polarization through said horn, and directing said amplified signal having said second polarization into output port.

5. The power combiner of claim 4, wherein said amplifying means comprises a plurality of element groups, each element group comprising:
    a first radiator element for receiving said input signal;
    an electronic amplifier for amplifying said received input signal and
    a second radiator element for transmitting said amplified signal with said second polarization.

6. The power combiner of claim 5, wherein said first and second radiator elements comprise a single ortho-linear radiator element.

7. The power combiner of claim 1, additionally comprising a heat sink coupled to said mounting plate having said plurality of amplifiers.

8. An apparatus for amplifying radiated millimeter wavelength signals, said apparatus comprising:
    a horn for guiding a radiated millimeter wavelength signal, said horn having a first end and a second end;
    a first antenna array supported at said second end of said horn, said antenna array comprising a first plurality of antenna elements for receiving said radiated millimeter wavelength signal transmitted through said horn;
    a plurality of amplifiers, each connected to a corresponding one of said antenna elements for amplifying said received signal to produce an amplified millimeter wavelength signal;
    a second antenna array supported at said second end of said horn, said antenna array comprising a second plurality of antenna elements, each connected to a corresponding one of said amplifiers, for radiating said amplified millimeter wavelength signal through said horn, wherein said second antenna array is directed in the same direction as said first antenna array.

9. The apparatus of claim 7, wherein said radiated millimeter wavelength signal has a first polarization, wherein said second plurality of antenna elements radiate said amplified millimeter wavelength signal with a second polarization so that said radiated millimeter wavelength signal and said amplified millimeter wavelength signal substantially do not interfere.

10. The apparatus of claim 9, wherein said first and second polarizations are orthogonal.

11. The apparatus of claim 10, wherein said first polarization is a vertical polarization and said second polarization is a horizontal polarization.

12. An apparatus for amplifying a millimeter wavelength electromagnetic signal, the apparatus comprising:
- an ortho-mode transducer having an input port for receiving a vertically polarized radiated millimeter wavelength electromagnetic signal;
- a horn having a first end and a second end, wherein said first end of said horn is connected to said ortho-mode transducer for guiding said vertically polarized signal;
- a first plurality of parasitically excited antenna elements spaced across said second end of said horn;
- a second plurality of active antenna elements spaced across said second end of said horn for receiving said vertically polarized signal after said signal passes through said parasitically excited antenna elements;
- a plurality of electronic power amplifiers, each connected to a corresponding one of said second plurality of antenna elements, for amplifying said received signal to produce an amplified signal;
- a third plurality of active antenna elements, each connected to a corresponding one of said amplifiers, for radiating said amplified signal, wherein:
- said third plurality of antenna elements radiates said amplified signal with a horizontal polarization;
- said third plurality of antenna elements radiates said horizontally polarized amplified signal through said horn toward said ortho-mode transducer; and
- wherein said transducer includes an output port for outputting said horizontally polarized amplified signal.

13. The apparatus of claim 12, additionally comprising a lens at said second end of said horn for collimating said radiated vertically polarized signal onto said first of antenna elements.

14. The apparatus for amplifying a millimeter wavelength electromagnetic signal of claim 12, additionally comprising a heat sink coupled to said plurality of electronic power amplifiers.

15. The apparatus for amplifying a millimeter wavelength electromagnetic signal of claim 14, wherein said horn is rectangular in cross section.

16. The apparatus for amplifying a millimeter wavelength electromagnetic signal of claim 14, wherein said horn is circular in cross section.

17. A method of amplifying a millimeter wavelength signal comprising:
- guiding a radiated millimeter wavelength electromagnetic signal having a first polarization through a waveguide horn from a first end of said horn to a second end of said horn;
- receiving said signal with an array of antenna elements at said second end of said horn;
- electronically amplifying said received signal to produce an amplified signal;
- radiating said amplified signal with a second polarization into said horn; and
- guiding said amplified signal through said horn from said second end of said horn to said first end of said horn.

18. The method of claim 17, additionally comprising discriminating at said first end of said horn between said radiated signal having said first polarization and said amplified signal having said second polarization.

19. The method of claim 18, wherein said second polarization is orthogonal to said first polarization.

* * * * *